(12) United States Patent
Mun et al.

(10) Patent No.: US 10,770,227 B2
(45) Date of Patent: Sep. 8, 2020

(54) CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Seon Jae Mun, Suwon-si (KR); Jae Yeol Choi, Suwon-si (KR); Seung Heui Lee, Suwon-si (KR); Jong Ho Lee, Suwon-si (KR); Kyoung Jin Cha, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 219 days.

(21) Appl. No.: 16/025,428

(22) Filed: Jul. 2, 2018

(65) Prior Publication Data

US 2019/0157003 A1 May 23, 2019

(30) Foreign Application Priority Data

Nov. 22, 2017 (KR) .................. 10-2017-0156673
Dec. 19, 2017 (KR) .................. 10-2017-0175277

(51) Int. Cl.
*H01G 4/008* (2006.01)
*H01G 2/06* (2006.01)
*H01G 4/30* (2006.01)
*H01G 4/232* (2006.01)
*H01G 4/12* (2006.01)
(Continued)

(52) U.S. Cl.
CPC ............ *H01G 4/008* (2013.01); *H01G 2/065* (2013.01); *H01G 4/2325* (2013.01); *H01G 4/30* (2013.01); *H01G 4/1227* (2013.01); *H01G 4/232* (2013.01); *H05K 1/181* (2013.01); *H05K 3/3442* (2013.01);
(Continued)

(58) Field of Classification Search
CPC ...... H01G 4/228; H01G 4/232; H01G 4/2325; H01G 4/008; H01G 4/0085; H01G 4/012; H01G 4/1227
See application file for complete search history.

(56) References Cited

U.S. PATENT DOCUMENTS 6,195,248 B1 * 2/2001 Kunishi ............... H01C 1/142
361/305
8,988,850 B1 * 3/2015 Kodama ............... H01G 4/232
361/301.4
(Continued)

FOREIGN PATENT DOCUMENTS

KR 10-2013-0115357 A 10/2013
KR 10-2015-0036391 A 4/2015
(Continued)

OTHER PUBLICATIONS

Korean Office Action dated Feb. 13, 2019 issued in Korean Patent Application No. 10-2017-0175277 (with English translation).
(Continued)

*Primary Examiner* — Eric W Thomas
(74) *Attorney, Agent, or Firm* — Morgan, Lewis & Bockius LLP

(57) ABSTRACT

A capacitor includes a body including dielectric layers and internal electrodes; and external electrodes disposed on the body. The capacitor includes Sn, the Sn having an alpha particle emission rate equal to or less than 0.02 cph/cm$^2$.

19 Claims, 4 Drawing Sheets

(51) Int. Cl.
*H05K 1/18* (2006.01)
*H05K 3/34* (2006.01)

(52) U.S. Cl.
CPC ............. *H05K 2201/10015* (2013.01); *H05K 2201/10159* (2013.01); *H05K 2201/10522* (2013.01)

(56) References Cited

U.S. PATENT DOCUMENTS

| | | | | |
|---|---|---|---|---|
| 2002/0001712 | A1* | 1/2002 | Higuchi | H01G 4/232 428/336 |
| 2013/0321980 | A1 | 12/2013 | Suzuki et al. | |
| 2015/0170838 | A1 | 6/2015 | Suzuki et al. | |
| 2016/0221878 | A1 | 8/2016 | Choi et al. | |
| 2017/0084392 | A1 | 3/2017 | An et al. | |

FOREIGN PATENT DOCUMENTS

| | | |
|---|---|---|
| KR | 10-2016-0095383 A | 8/2016 |
| KR | 10-2017-0033638 A | 3/2017 |

OTHER PUBLICATIONS

M. S. Gordon, et al., "Alpha-Particle Emission Energy Spectra From Materials Used for Solder Bumps," IEEE Transactions on Nuclear Science, vol. 57, No. 6, Dec. 2010, pp. 3251-3256.
Kumar, Santosh, et. al, "Soft Error Issue and Importance of Low Alpha Solders for Microelectronics Packaging", Rev. Adv. Mater. Sci 34, pp. 185-202, 2013.
http://www.dshm.co.kr/eng/business_lowalphatin.html.
M.S. Gordon, et al., 'Alpha-Particle Emission Energy Spectra From Materials Used for Solder Bumps', IEEE Transactions on Nuclear Science, Dec. 13, 2010, pp. 3251-3256, vol. 57, No. 6.
Office Action issued in corresponding Korean Application No. 10-2017-0175277, dated Feb. 13, 2019.

\* cited by examiner

CAPACITOR AND BOARD HAVING THE SAME

CROSS-REFERENCE TO RELATED APPLICATION(S)

This application claims the benefit of priority to Korean Patent Application Nos. 10-2017-0156673 filed on Nov. 22, 2017 and 10-2017-0175277 filed on Dec. 19, 2017 in the Korean Intellectual Property Office, the disclosure of which is incorporated herein by reference in its entirety.

BACKGROUND

1. Field

The present disclosure relates to a capacitor and a board having the same.

2. Description of Related Art

In accordance with the miniaturization of electronic products and increases in the size of batteries for increasing durations of use time of portable electronic products, limitations on the number and a size of passive elements, as well as on a size of a printed circuit board (PCB), have increased.

Accordingly, demand for miniaturization and high capacitance of a capacitor has increased, and demand for densification and high capacitance of a semiconductor device using Sn (tin) as a raw material has also increased.

However, Sn may emit a large amount of alpha radiation, and when Sn is disposed in the vicinity of a semiconductor chip, for example due to the miniaturization and densification thereof, a soft error causing loss of information of a memory cell may occur.

There is thus a need to use Sn which only emits a small amount of alpha radiation as Sn included in a semiconductor and solder in order to decrease a soft error. In addition, a capacitor, which is a component adjacent to the semiconductor, is not affected by errors such as the soft error.

SUMMARY

An aspect of the present disclosure may prevent a soft error by controlling an alpha particle emission rate of Sn (tin) included in a capacitor.

According to an aspect of the present disclosure, a capacitor includes a body including dielectric layers and internal electrodes; and external electrodes disposed on the body. The capacitor includes Sn, the Sn having an alpha particle emission rate equal to or less than 0.02 cph/cm$^2$.

According to another aspect of the present disclosure, a board having a capacitor includes a printed circuit board having one surface on which an electrode pad is disposed; and the capacitor mounted on the printed circuit board.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Capacitor

Figure 1:
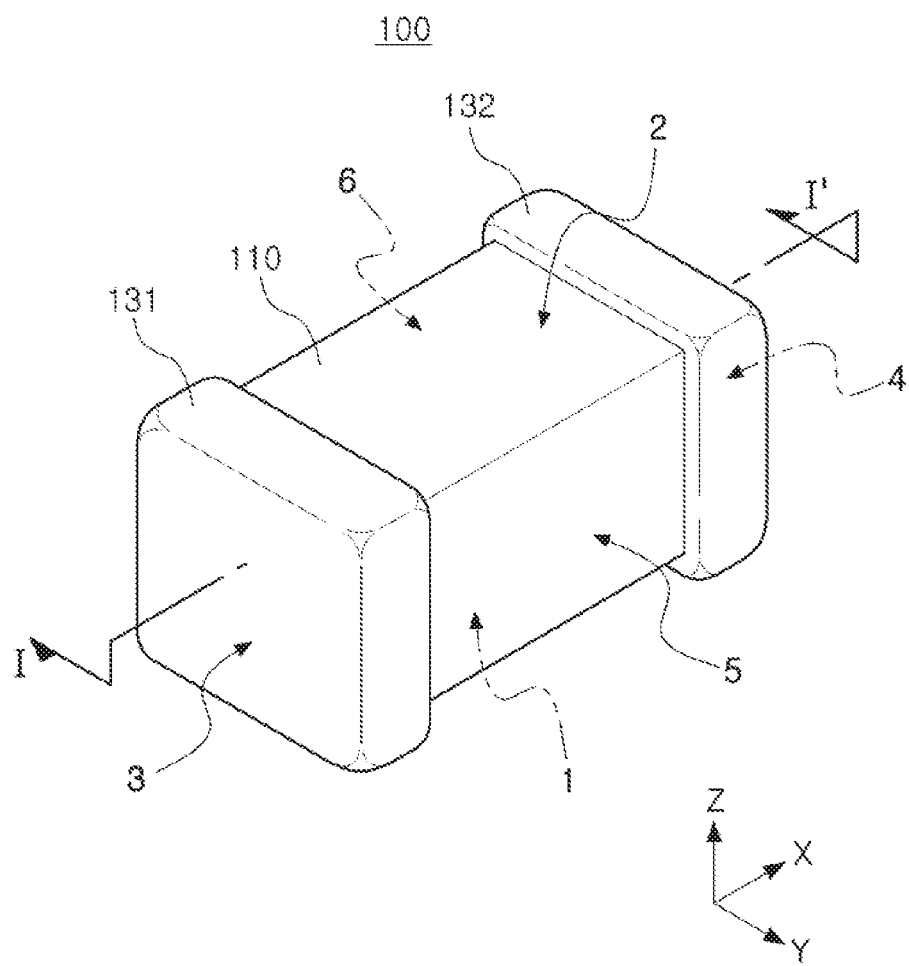
FIG. 1 is a schematic perspective view of a capacitor according to an exemplary embodiment in the present disclosure.
Figure 2:
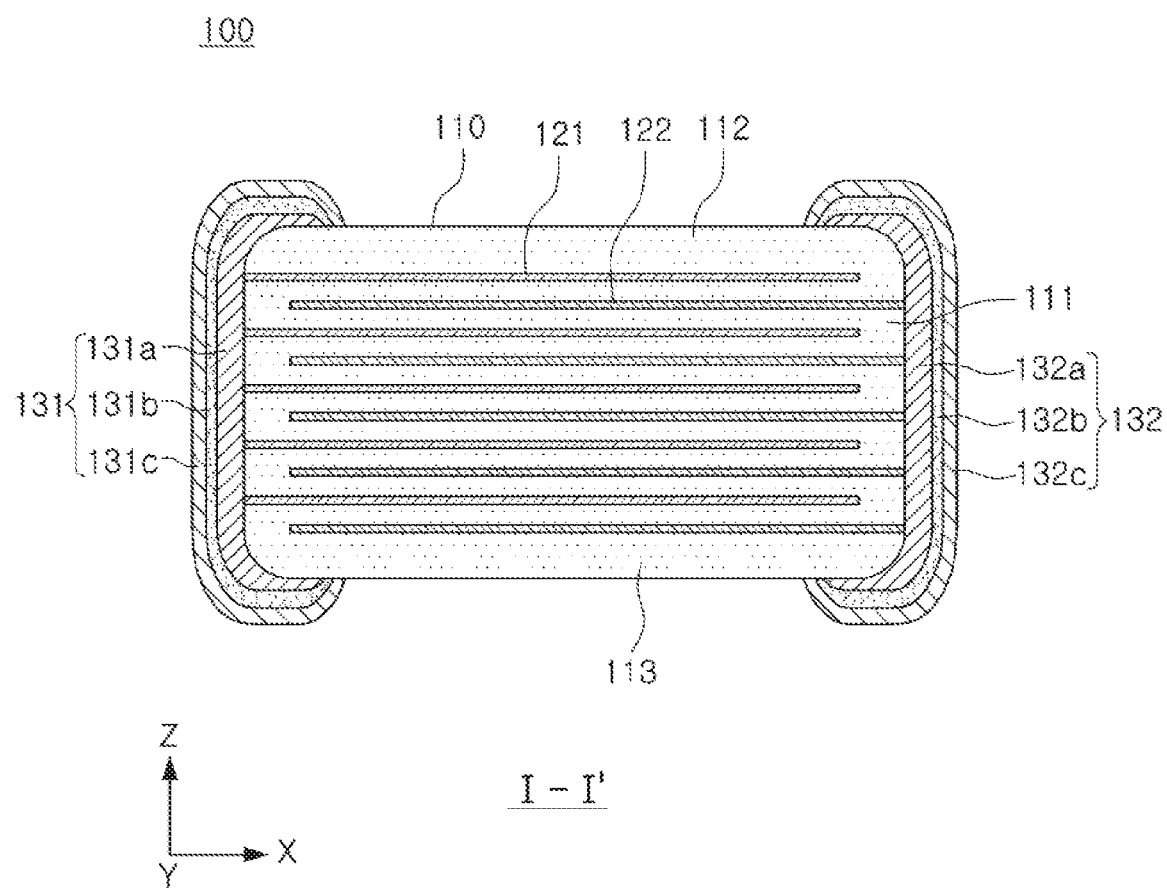
FIG. 2 is a schematic cross-sectional view taken along line I-I' in FIG. 1.

FIG. 1 is a schematic perspective view of a capacitor according to an exemplary embodiment in the present disclosure. FIG. 2 is a schematic cross-sectional view taken along line I-I' in FIG. 1.

Hereinafter, a capacitor 100 according to an exemplary embodiment in the present disclosure will be described with reference to FIGS. 1 and 2.

Referring to FIG. 1, the capacitor 100 according to the exemplary embodiment in the present disclosure includes a body 110 including dielectric layers 111 and internal electrodes 121 and 122, and external electrodes 131 and 132 disposed on the body 110, and includes Sn (tin), the Sn having an alpha particle emission rate equal to or less than 0.02 counts per hour (cph)/cm$^2$.

In general, tin (Sn) is a main raw material of solder, and has been widely used for applications including manufacture of a semiconductor device, bonding between a semiconductor chip and a board, bonding of a silicon chip such as an integrated circuit (IC) or a large scale integrated circuit (LSI) to a lead frame or a ceramic package, tape automated bonding (TAB) or a flip chip, formation of solder at the time of manufacturing a capacitor, a wiring material for a semiconductor, and the like.

Sn may be classified into high alpha solder (HAS), low alpha solder (LAS), and ultra low alpha solder (ULAS) according to an alpha particle emission rate. The HAS means Sn having an alpha particle emission rate of greater than 0.02 cph/cm$^2$, the LAS means Sn having an alpha particle emission rate equal to or less than 0.02 cph/cm$^2$, and the ULAS refers to Sn having an alpha particle emission rate equal to or less than 0.002 cph/cm$^2$.

Alpha particles or alpha rays are one type of highly ionizing particle radiation. The alpha particles or alpha rays have low penetration depth and consist of two protons and two neutrons. That is, the alpha particles or alpha rays have the same constitution as helium nuclei, and thus may also be represented as He$^{2+}$ indicating a helium ion with a positive charge of +2.

When the HAS which is Sn having a high alpha particle emission rate is used as a main raw material for a semiconductor device and solder, the semiconductor device may be subjected to irradiation of high energy alpha radiation incurring charge disturbance to an extent that data in a memory element or a recording device is disturbed. If a certain level or more of charge disturbance occurs, a soft error where a digital signal in a memory element or recording device is converted from 0 to 1 or 1 to 0 occurs. This is because the alpha radiation enters a silicon crystal to form a plurality of electron hole pairs, and these carriers are mixed in charges of a memory or a logic circuit performing a dynamic operation to cause inversion of a state of the charge.

Generally, in a case in which a separate refinement process, or the like is not performed, since most Sn corresponds to HAS having a high alpha particle emission rate, a soft error maybe caused if a separate control is not performed. Therefore, there is a move to use Sn having a low alpha particle emission rate for a semiconductor in order to decrease a soft error, but a capacitor which is a component adjacent to the semiconductor does not exhibit soft errors.

However, even when Sn having a low alpha particle emission rate is used for a semiconductor, solder, or the like, if Sn having a high alpha particle emission rate is included in the capacitor, a soft error maybe caused since the capacitor is disposed adjacent to the semiconductor.

The capacitor according to the exemplary embodiment may include Sn, and the Sn may be controlled to have an alpha particle emission rate equal to or less than 0.02 cph/cm$^2$, thereby preventing a soft error in the adjacent semiconductor.

Further, in order to more effectively prevent a soft error, the Sn may be controlled to have an alpha particle emission rate equal to or less than 0.002 cph/cm$^2$.

The body 110 has first and second surfaces 1 and 2 opposing each other in a thickness direction (Z direction), third and fourth surfaces 3 and 4 connected to the first and second surfaces 1 and 2 and opposing each other in a width direction (Y direction), and fifth and sixth surfaces 5 and 6 connected to the first and second surfaces 1 and 2 and the third and fourth surfaces 3 and 4 and opposing each other in a length direction (X direction). At this time, the first surface may become a mounting surface.

The body 110 may be formed by stacking a plurality of dielectric layers 111 in the thickness direction (Z direction) and then sintering the stacked dielectric layers, and a shape and dimensions of the body 110 and the number of stacked dielectric layers 111 are not limited to those illustrated in the present exemplary embodiment.

The plurality of dielectric layers 111 forming the body 110 are in a sintered state and may be integrated so that boundaries between adjacent dielectric layers 111 are not readily apparent without using a scanning electron microscope (SEM).

A raw material of the dielectric layer 111 is not particularly limited as long as sufficient capacitance may be obtained. For example, the raw material may be barium titanate (BaTiO$_3$) powder. A material of the dielectric layer 111 may be prepared by adding various ceramic additives, organic solvents, plasticizers, binders, dispersing agents, and the like to powder such as barium titanate (BaTiO$_3$) powder, according to an object of the present disclosure.

Cover layers 112 and 113 formed by stacking dielectric layers on which internal electrodes are not formed may be provided at an upper portion and a lower portion of the body 110, respectively. The cover layers 112 and 113 may serve to maintain reliability of the capacitor against external impact.

In addition, Sn included in the capacitor 100 may be included in the dielectric layer 111, and may also be included in the cover layers 112 and 113.

Referring to FIG. 2, the body 110 may include the dielectric layers 111 and the internal electrodes 121 and 122 disposed to be alternately exposed to the third and fourth surfaces 3 and 4 with each of the dielectric layers 111 interposed therebetween.

The first and second internal electrodes 121 and 122 are a pair of electrodes having polarities different from each other and are electrically insulated from each other by the dielectric layer 111 interposed therebetween.

The first and second internal electrodes 121 and 122 are alternately exposed to the third and fourth surfaces 3 and 4 of the body 110 in the length direction (X direction) to thereby be connected to the first and second external electrodes 131 and 132 disposed on an outer portion of the body 110.

A thickness of the first and second internal electrodes 121 and 122 may be determined according to a use.

For example, the thickness of the first and second internal electrodes 121 and 122 may be in a range of 0.2 to 1.0 µm considering a size of the body 110, but is not necessarily limited thereto.

The first and second internal electrodes 121 and 122 may include a conductive metal such as nickel (Ni), copper (Cu), palladium (Pd), silver (Ag), lead (Pb), or platinum (Pt) alone or an alloy thereof.

In addition, Sn included in the capacitor 100 may be included in the internal electrodes 121 and 122. By including Sn in the internal electrodes, reliability of moisture resistance may be improved. Further, trapping of a common material of the internal electrode may be suppressed, and connectivity of the electrodes may be improved.

At this time, a content of Sn included in the internal electrodes may be 0.1 to 10 wt % based on the entire internal electrodes. When the content of Sn is less than 0.1 wt %, the effect of improving reliability of moisture resistance may be insufficient, and when the content of Sn exceeds 10 wt %, deterioration in reliability and characteristics maybe caused.

Further, Sn may be present in the internal electrodes alone and may be present in a form of an alloy with a material forming the internal electrodes.

The external electrodes 131 and 132 are each disposed on one surface of the body 110 and come in contact with the internal electrodes 121 and 122. The external electrodes 131 and 132 may include first and second external electrodes 131 and 132 connected to the first and second internal electrodes 121 and 122, respectively.

The first external electrode 131 may include an electrode layer 131a disposed on the body 110, a first plating layer 131b formed on the electrode layer 131a, and a second plating layer 131c formed on the first plating layer 131b, and the second external electrode 132 may include an electrode layer 132a disposed on the body 110, a first plating layer 132b formed on the electrode layer 132a, and a second plating layer 132c formed on the first plating layer 132b.

The electrode layers 131a and 132a may be a sintered electrode including a conductive metal and glass, and the conductive metal may be copper (Cu). Further, the electrode layers 131a and 132a may be a resin-based electrode including a plurality of metal particles and a conductive resin.

The first plating layers 131b and 132b may be, for example, a Ni plating layer, but is not limited thereto.

At this time, Sn included in the capacitor 100 may be included in the second plating layers 131c and 132c. That is, the second plating layers 131c and 132c may be a plating layer including Sn, serve to enhance adhesion with solder 230, and have an alpha particle emission rate equal to or less than 0.02 cph/cm$^2$, thereby preventing a soft error.

As described above, the capacitor according to the present disclosure includes Sn having an alpha particle emission rate equal to or less than 0.02 cph/cm$^2$, thereby preventing a soft error.

However, a position where Sn is included in the capacitor 100 need not particularly be limited, and it is to be noted that a case in which Sn is included in a component other than the above described positions is not excluded from the scope of the present disclosure.

Board Having Capacitor

Figure 3:
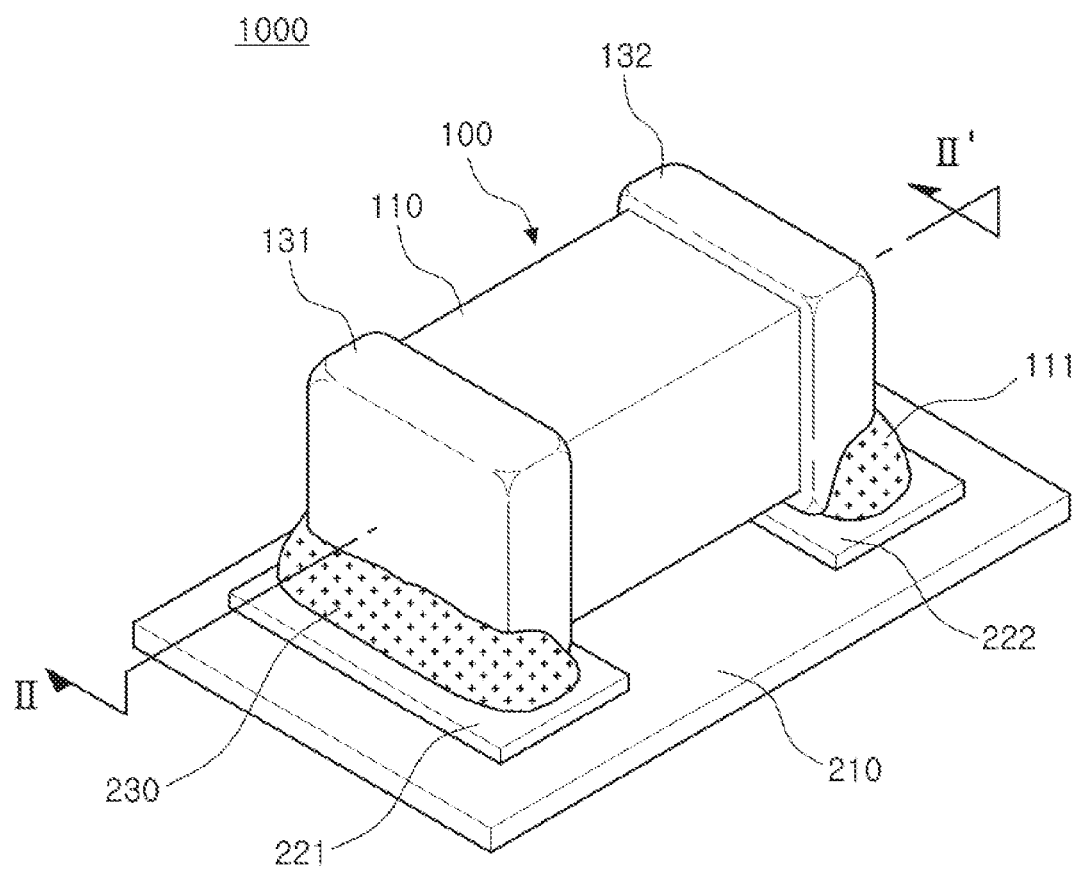
FIG. 3 is a perspective view illustrating a state in which the capacitor of FIG. 1 is mounted on a printed circuit board.
Figure 4:
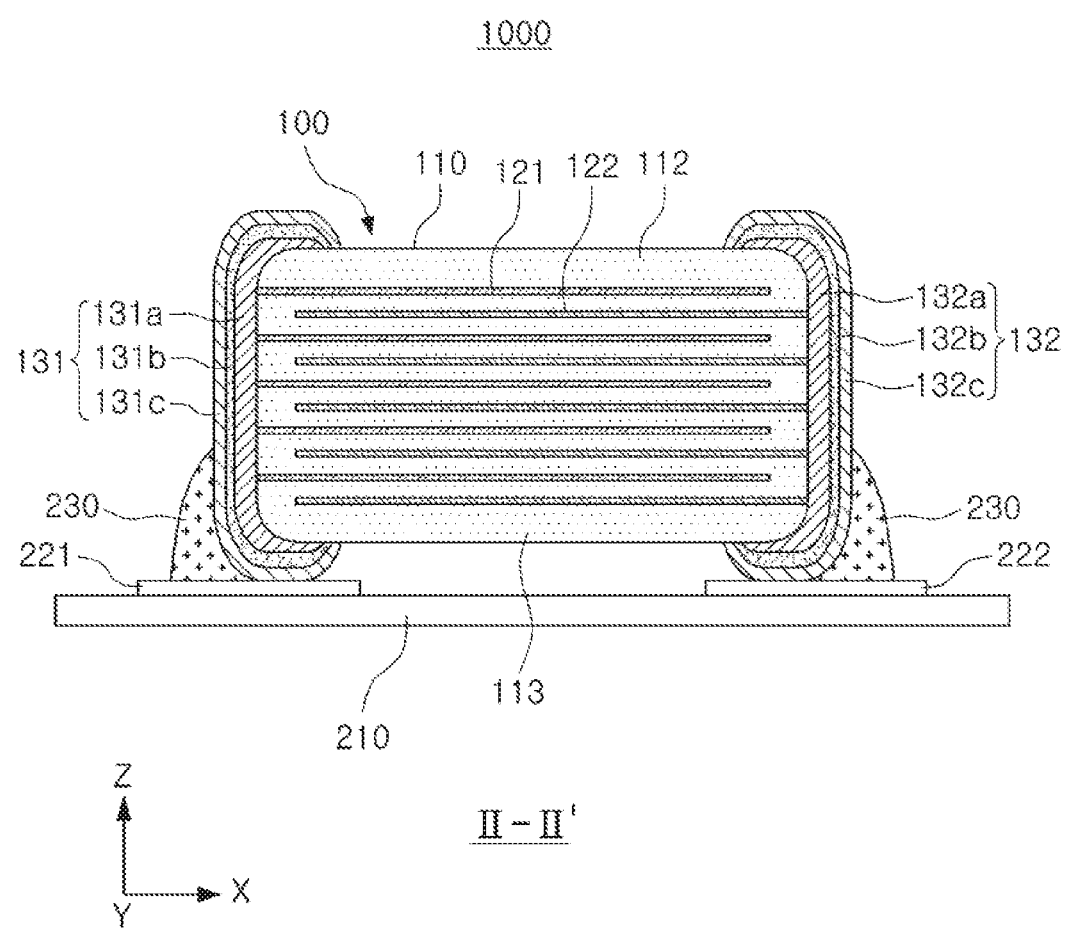
FIG. 4 is a schematic cross-sectional view taken along line II-II' in FIG. 3.

FIG. 3 is a perspective view illustrating a state in which the capacitor of FIG. 1 is mounted on a printed circuit board. FIG. 4 is a schematic cross-sectional view taken along line II-II' in FIG. 3.

Referring to FIGS. 3 and 4, a board 1000 having a capacitor according to another exemplary embodiment in the present disclosure may include a printed circuit board 210 on which the capacitor 100 is horizontally mounted and electrode pads 221 and 222 formed on an upper surface of the printed circuit board 210.

At this time, the electrode pads 221 and 222 are formed to be spaced apart from each other and come in contact with the first and second external electrodes 131 and 132 of the capacitor 100, respectively.

Further, the external electrodes 131 and 132 of the capacitor are positioned on the electrode pads 221 and 222 to come in contact with the electrode pads 221 and 222, respectively, and the external electrodes 131 and 132 and the electrode pads 221 and 222 may be connected to each other by the solder 230 including Sn having an alpha particle emission rate equal to or less than 0.02 cph/cm$^2$.

This is because if the alpha particle emission rate of Sn included in the solder 230 is greater than 0.02 cph/cm$^2$, a soft error may occur.

At this time, in order to more effectively prevent a soft error, Sn included in the solder 230 may have an alpha particle emission rate equal to or less than 0.002 cph/cm$^2$.

Except for the above description, overlapped descriptions of the characteristics of the capacitor according to the above-described exemplary embodiment in the present disclosure will be omitted.

As set forth above, the capacitor according to exemplary embodiments in the present disclosure includes Sn having an alpha particle emission rate equal to or less than 0.02 cph/cm$^2$, thereby preventing a soft error.

While exemplary embodiments have been shown and described above, it will be apparent to those skilled in the art that modifications and variations could be made without departing from the scope of the present invention as defined by the appended claims.

What is claimed is:

1. A capacitor, comprising:
   a body including dielectric layers and internal electrodes; and
   external electrodes disposed on the body,
   wherein the capacitor includes Sn, the Sn having an alpha particle emission rate equal to or less than 0.02 cph/cm$^2$.

2. The capacitor of claim 1, wherein the Sn has an alpha particle emission rate equal to or less than 0.002 cph/cm$^2$.

3. The capacitor of claim 1, wherein the internal electrodes include the Sn.

4. The capacitor of claim 3, wherein a content of the Sn included in the internal electrode is 0.1 to 10 wt% based on the entire internal electrode.

5. The capacitor of claim 1, wherein the external electrode includes an electrode layer connected to the internal electrode and disposed on the body, a first plating layer formed on the electrode layer, and a second plating layer formed on the first plating layer.

6. The capacitor of claim 5, wherein the second plating layer includes the Sn.

7. The capacitor of claim 1, wherein the dielectric layer includes the Sn.

8. The capacitor of claim 1, wherein the external electrodes are disposed directly on the body, and
   wherein at least one of the body or the external electrodes includes the Sn having an alpha particle emission rate equal to or less than 0.02 cph/cm$^2$.

9. A board having a capacitor, comprising:
   a printed circuit board having one surface on which an electrode pad is disposed; and
   the capacitor mounted on the printed circuit board,
   wherein the capacitor comprises a body including dielectric layers and internal electrodes, and external electrodes disposed on the body, and
   wherein the capacitor includes Sn, the Sn having an alpha particle emission rate equal to or less than 0.02 cph/cm$^2$.

10. The board having the capacitor of claim 9, wherein the external electrode of the capacitor is positioned on the electrode pad to come in contact with the electrode pad, and the external electrode and the electrode pad are connected to each other by solder including Sn having an alpha particle emission rate equal to or less than 0.02 cph/cm$^2$.

11. The board having the capacitor of claim 10, wherein the Sn included in the solder has an alpha particle emission rate equal to or less than 0.002 cph/cm$^2$.

12. The board having the capacitor of claim 9, further comprising a semiconductor device disposed adjacent to the capacitor.

13. The board having the capacitor of claim 9, wherein the Sn has an alpha particle emission rate equal to or less than 0.002 cph/cm$^2$.

14. The board having the capacitor of claim 9, wherein the internal electrodes include the Sn.

15. The board having the capacitor of claim 14, wherein a content of the Sn included in the internal electrode is 0.1 to 10 wt% based on the entire internal electrode.

16. The board having the capacitor of claim 9, wherein the external electrode includes an electrode layer connected to the internal electrode and disposed on the body, a first plating layer formed on the electrode layer, and a second plating layer formed on the first plating layer.

17. The board having the capacitor of claim 16, wherein the second plating layer includes the Sn.

18. The board having the capacitor of claim 9, wherein the dielectric layer includes the Sn.

19. The board having the capacitor of claim 9, wherein the external electrodes are disposed directly on the body, and
   wherein at least one of the body or the external electrodes includes the Sn having an alpha particle emission rate equal to or less than 0.02 cph/cm$^2$.

* * * * *